United States Patent [19]

Geisler et al.

[11] Patent Number: 5,296,784
[45] Date of Patent: Mar. 22, 1994

[54] APPARATUS FOR THE PRODUCTION OF GLOW DISCHARGE

[75] Inventors: Michael Geisler, Waechtersbach; Michael Jung, Kahl/Main; Rudolf Koetter-Faulhaber, Karben, all of Fed. Rep. of Germany

[73] Assignee: Leybold Aktiengesllschaft, Hanau, Fed. Rep. of Germany

[21] Appl. No.: 795,988

[22] Filed: Nov. 22, 1991

[30] Foreign Application Priority Data

Mar. 14, 1991 [DE] Fed. Rep. of Germany ....... 4108212
Apr. 23, 1991 [DE] Fed. Rep. of Germany ....... 4113142

[51] Int. Cl.$^5$ .............................................. H01J 7/24
[52] U.S. Cl. ....................... 315/111.41; 314/111.51; 314/111.71; 333/99 PL; 204/298.38; 118/723 AN
[58] Field of Search ............... 315/111.41, 111.51, 315/111.71; 333/227, 99 PL; 118/723; 204/298.38

[56] References Cited

U.S. PATENT DOCUMENTS

| | | | |
|---|---|---|---|
| 3,255,404 | 6/1966 | Kidwell | 333/99 PL |
| 4,987,346 | 1/1991 | Katzachner et al. | 315/111.41 |
| 5,021,919 | 6/1991 | Engemann | 315/111.41 |
| 5,134,965 | 8/1992 | Tokuda et al. | 118/723 |
| 5,227,695 | 7/1993 | Pelletier et al. | 315/111.21 |

*Primary Examiner*—Robert J. Pascal
*Assistant Examiner*—Michael B. Shingleton
*Attorney, Agent, or Firm*—Felfe & Lynch

[57] ABSTRACT

Apparatus for the production of glow discharge, preferably for a large-area plasma CVD process, including a vacuum coating chamber (K) and a microwave waveguide resonator with one or more coupling points, wherein the resonator is made in the form of a microwave waveguide ring resonator (13, 13'), reaction zones (R) are formed at the coupling points between the microwave waveguide ring resonator (13, 13') and the vacuum chamber (K), and in each case a series of magnets (5, 5', . . . ; 6, 6', . . . ) of different polarity are provided, so that in front of the reaction zone (R) individual tunnels of magnetic field lines (16, 16') running parallel thereto are formed and each magnetic field (16, 16') encloses a spatially uniform plasma tube (17) in the reaction zone (R).

10 Claims, 4 Drawing Sheets

APPARATUS FOR THE PRODUCTION OF GLOW DISCHARGE

The invention relates to an apparatus for the production of glow discharge, preferably for a large-area plasma chemical vapor depositing process, comprising a vacuum coating chamber and a microwave waveguide resonator with one or more coupling points.

BACKGROUND OF THE INVENTION

In the state of the art apparatus which consist, for example, of a microwave waveguide which is connected via a coupling point to a funnel or horn antenna, are known. By means of this antenna the microwaves are coupled into a vacuum coating chamber through a quartz glass window, making a plasma CVD process, for example, possible in this chamber.

Furthermore, apparatus are known which have a microwave waveguide which by means of a coupling point transmit the microwaves to a microwave waveguide resonator.

This waveguide resonator is characterized by a standing interference pattern of the microwave field, as well as one or more coupling points for supplying the glow discharge for anticorrosion processes and ECR wafer dry etching processes.

These known apparatus with funnel or horn antennas have the disadvantage that, among other things, the quartz glass window between the antenna and the vacuum chamber is also coated during the coating process and thus affects or prevents the passage of the microwaves.

The apparatus with a microwave waveguide resonator have the disadvantage that tuning of the resonator length, resonator position and the coupler is necessary. Moreover, due to the standing interference pattern of the microwave field, in many cases a plasma that is not sufficiently uniform spatially is obtained, and consequently an unsatisfactory distribution of the coating rates, in a PCVD process, for example.

It is therefore the object of the present invention, first to find an apparatus that is independent of a device, such as the quartz glass window for example, which will lastingly affect the microwaves before they enter into the interior of a coating chamber. Secondly, an apparatus is to be found which, over the average time, will permit a spatially more uniform distribution of the coating rates of large-area substrates, such as searchlight reflector inserts, in a PCVD process.

SUMMARY OF THE INVENTION

This problem is solved according to the invention in that
a) the resonator is configured as a microwave waveguide ring resonator, and is provided preferably outside of the chamber on the outside wall in the area of a planar section or in a section reaching around the chamber as a whole,
b) at the coupling points between the microwave waveguide ring resonator and the vacuum chamber a reaction zone is formed which can best have the same ring-shaped configuration as the resonator and is situated preferably directly on the inside of the chamber wall, and
c) in the area of the defining plane lying radially outside and radially inside or in the area of the front and back defining plane of the reaction zone assuming a ring shape, a row of magnets of different polarities are provided which are situated for example on the inside of the chamber wall within the vacuum, so that in front of the reaction zone a tunnel of magnetic lines of force running parallel to the latter is formed and the magnetic field encloses a spatially uniform plasma tube in the reaction zone.

This apparatus advantageously has a microwave waveguide ring resonator which, with an antenna system—in the form of coupling loops for example—is best suited for the production of glow . discharge, preferably in a PCVD process, for the coating of large-area, planar substrates.

Likewise, with a modified antenna system, it is possible to coat all sides of tubular substrates, for example. With the apparatus according to the invention a plasma can be adjusted which has a decidedly improved spatial uniformity, and advantageously permits a uniform distribution of the coating rates, preferably in a PCVD process. Tuning of the coupler positions is no longer necessary.

Additional features and possibilities of embodiment are described and identified in the subordinate claims.

BRIEF DESCRIPTION OF THE DRAWINGS

The invention admits of a great variety of embodiments; some of them are represented in the appended drawings, wherein.

DESCRIPTION OF THE PREFERRED EMBODIMENT

Figure 1:
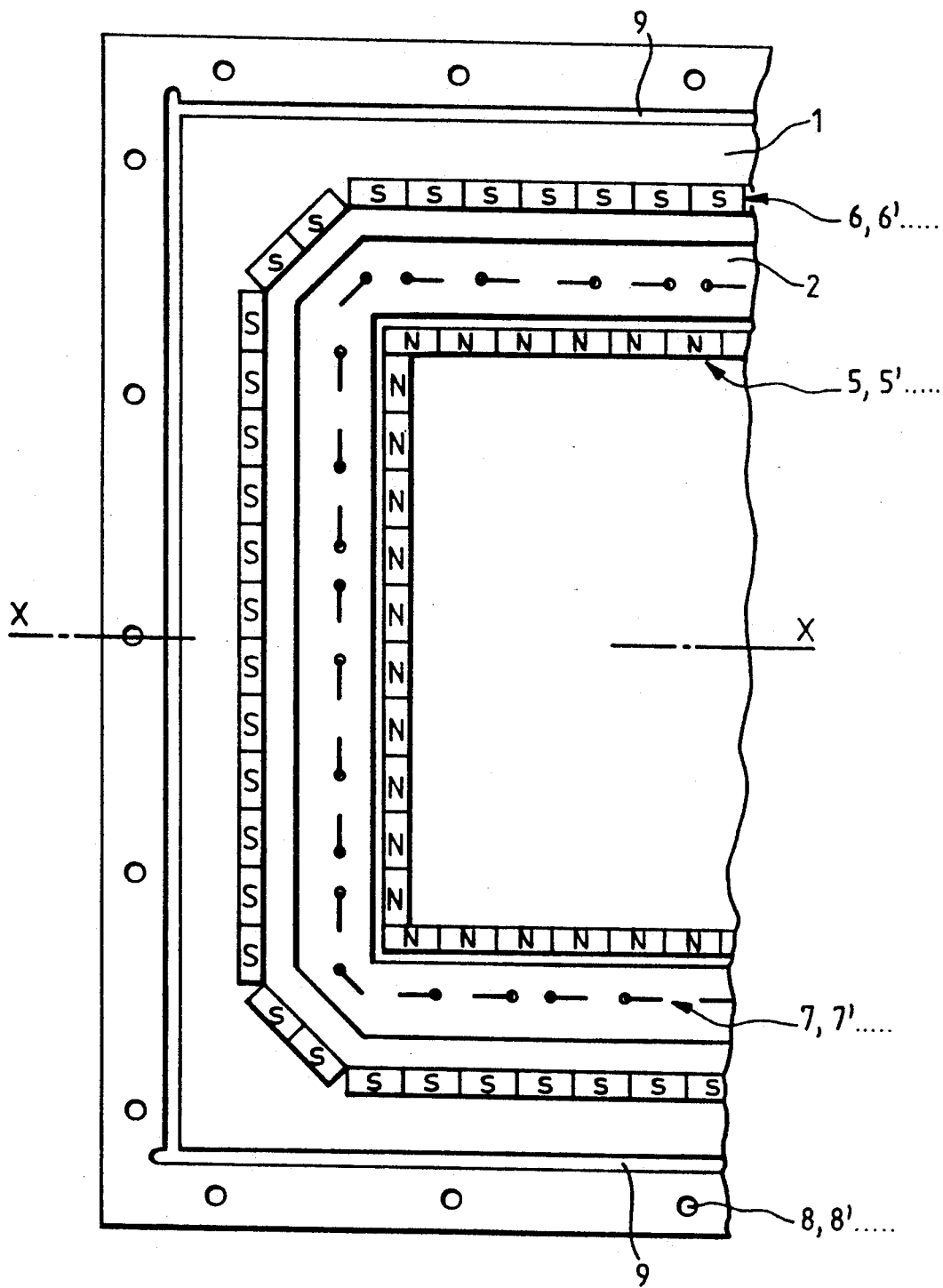
FIG. 1 shows a supporting plate with a microwave waveguide resonator with an antenna array in a flat embodiment, in a plan view from the vacuum side, and forming a planar active surface over which substrates can be moved.

A planar, rectangular support plate 1 (FIG. 1) is provided on its vacuum side with a groove 2 running parallel to the outside edges of the plate 1.

As the drawing shows, there is a train of equipolar magnets 5, 5', ... and 6, 6', ..., on the inside and outside of the circumferential groove 2; both trains are parallel to and at a constant distance from the groove 2. The magnetic north pole 5, 5', ... lies in the radially inward side of the circumferential groove 2, while the magnets 6, 6', ... are outside of the groove 2 and are configured as a south pole. In the bottom of the groove is disposed a series of coupling loops 7, 7', ..., also referred to as antennas, such that they are at a constant distance apart and are oriented invertingly and non-investingly in pairs.

Parallel to the outer margin of plate 1 there is provided a circumferential row of through-bores 8, 8', ... adjoining a likewise circumferential sealing groove 9.

Figure 2:
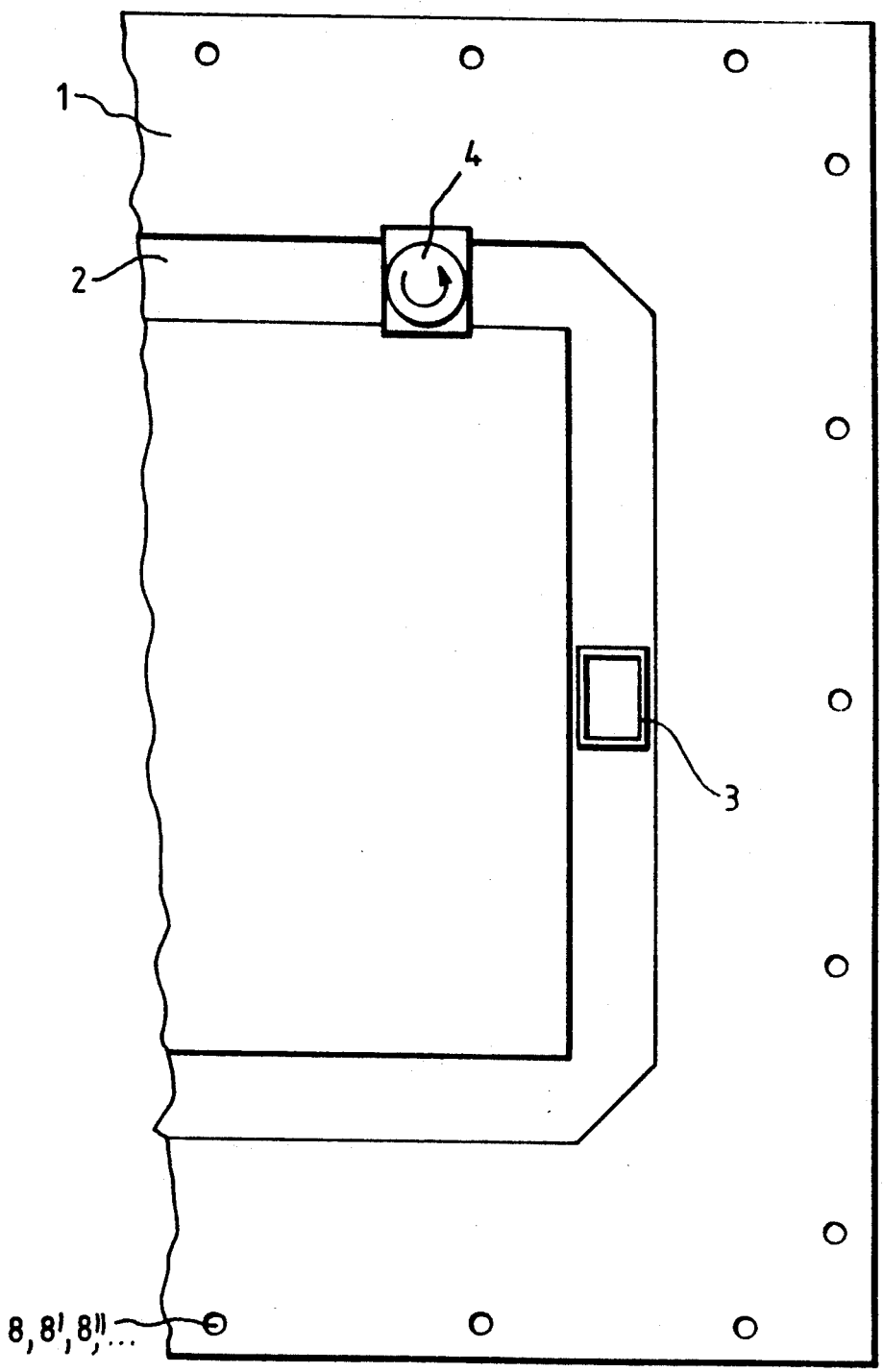
FIG. 2 shows a supporting plate according to FIG. 1 but from the atmospheric pressure side.

On the atmospheric side A of the support plate 1 (FIG. 2) a waveguide connection 3 leads perpendicularly in the groove 2, in the center of the longitudinal side of the groove. On the shorter, upper transverse side of groove 2 is a 4.

Figure 3:
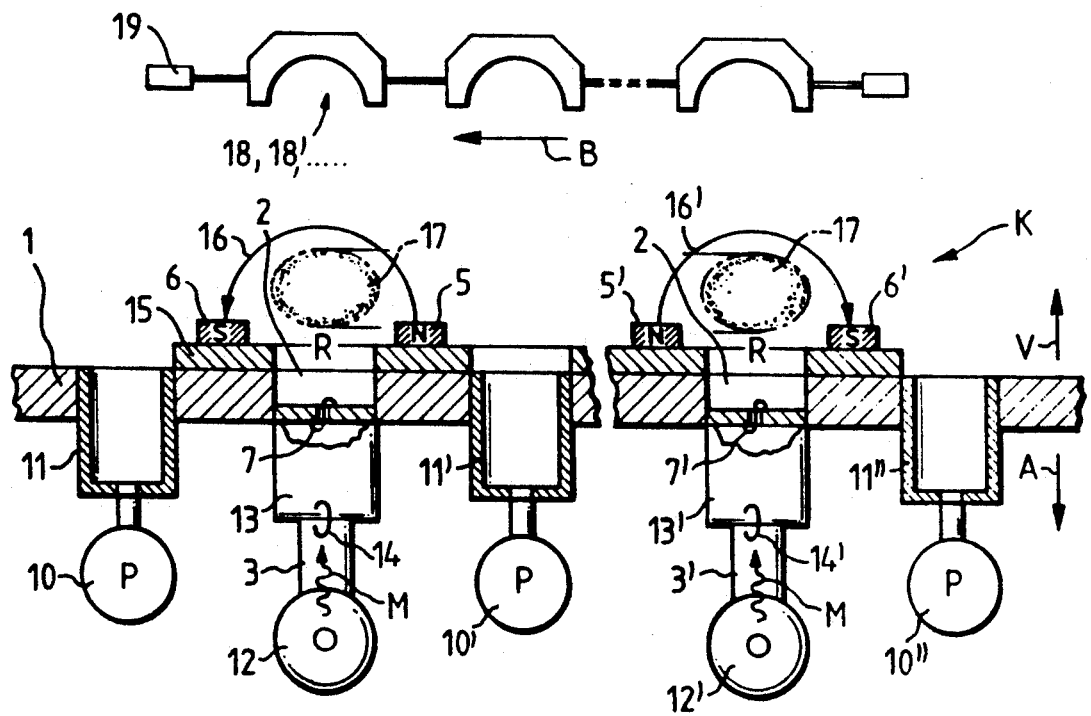
FIG. 3 shows in section a microwave waveguide resonator according to FIG. 1, but also with pump system and with substrates to be coated.

A sectional diagram along the plane X—X of FIG. 1 is shown in FIG. 3. On the atmospheric pressure side A of flat plate 1 are the vacuum pumps 10, 10', 10", which are connected by vacuum lines 11, 11', 11" with the plate 1, so that on the opposite side of the plate 1 a vacuum V can be produced. Between the pumps 10, 10', 10" are disposed two microwave sources 12, 12', which in turn are connected by a waveguide connection each with a waveguide ring resonator 13, 13'.

The latter in turn, coming from the atmospheric pressure side A, leads into the circumferential groove 2 of plate 1. The microwaves M emitted by the sources 12, 12' are transmitted by means of coupling loops 14, 14', from the waveguide connections 3, 3', to the waveguide ring resonators 13, 13', and from the latter by means of the coupling loops 7,7', through the circumferential groove 2 into a reaction zone R situated on the vacuum side V.

On both sides of the groove 2 the magnet pairs 5, 6, and 5' 6' are situated on the vacuum side V of plate 1 and are joined together by a common yoke 15. Between the magnets 5, 6, and 5', 6', a magnetic field is formed, and the magnetic lines of force 16, 16', are established which enclose a self-contained plasma tube 17 in the reaction zone R.

The substrates 18, 18', . . . that are to be coated in the vacuum V can be moved in direction B past the magnets 5', 6' and 5, 6, the substrates 18, 18', . . . being inserted into a carrier 19 and the plane of movement direction B being parallel to the main length direction of the flange plate 1.

Figure 4:
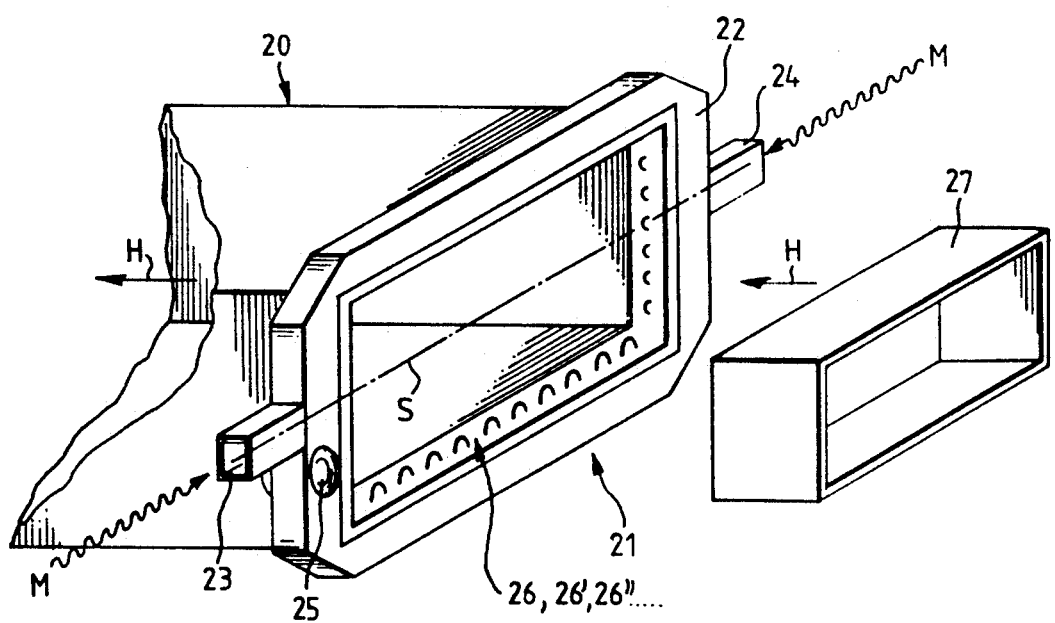
FIG. 4 shows in perspective a microwave waveguide resonator generally similar to FIG. 3, but in tubular form, without magnet system and pump system., and through which substrates can be moved.

A vacuum chamber 20, of which a portion is shown in FIG. 4, has rectangular cross section. One end 21 of the chamber is open, so that the interior of the chamber is fully accessible from this front end 21. A waveguide 22 of rectangular tubing is formed into a closed ring, this ring reaches around the chamber 20 and is flush with its front end 21. In the center of the vertical sections of the waveguide 22, waveguide connections 23 and 24 lead each perpendicularly into the outside of the waveguide 22, so that an imaginary line running through both of the waveguide connections 23 and 24 is an axis of symmetry S of the waveguide 22. A circulator 25 is integrated into the waveguide 22 in the direct vicinity of the waveguide connection 23. On the insides of the waveguide 22, coupling loops 26, 26', . . . are provided, which are disposed at regular intervals and in a linear circumferential row, and reach into the interior of the chamber 20.

The microwaves M are produced by one or more microwave sources not shown and are fed into the waveguide connections 23 and 24. From these the microwaves M enter into the waveguide ring resonator 22 and pass through the coupling loops 26, 26', . . . into the interior of the chamber 20. A substrate 27 that is to be coated and is smaller in its cross-sectional area than the freely accessible cross-sectional area of the chamber 20 can be moved through chamber 20 in the direction of the main axis H.

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. Apparatus for the production of glow discharge, particularly for a large-area plasma CVD process, comprising: a vacuum coating chamber having an outer wall, and microwave waveguide resonator means with discrete coupling points each comprising an antenna, the resonator means being microwave waveguide ring resonator means and disposed in the area of the outer wall of the chamber, reaction zones each being formed at each of the discrete coupling points between the microwave waveguide ring resonator means and the vacuum chamber, the reaction zones having a similar ring-like composite configuration to the resonator means and being disposed on the inside of the chamber wall, individual spatially uniform plasma clouds being disposed in the individual reaction zones, and a series of permanent magnets of different polarity being disposed in the area of the annularly formed reaction zones, the magnets being so disposed inside the chamber wall that in front of the reaction zones a tunnel of magnetic field lines running parallel thereto is formed between magnet poles, and the magnetic field lines covering the individual spatially uniform plasma clouds of the reaction zones.

2. Apparatus for the production of glow discharge according to claim 1, which includes microwave sources for feeding the microwaves into the waveguide ring resonator means.

3. Apparatus for the production of glow discharge according to claim 1, in which the waveguide ring resonator means is made from a tube of tetrahedral cross section.

4. Apparatus for the production of glow discharge according to claim 1, in which the waveguide ring resonator means is made in the form of a coaxially disposed rectangle.

5. Apparatus for the production of glow discharge according to claim 1, in which the waveguide ring resonator means is fastenable on a flat plate.

6. Apparatus for the production of glow discharge according to claim 1, in which the antennas at the coupling points between the waveguide ring resonator means and the reaction zones are coupling loops.

7. Apparatus for the production of glow discharge according to claim 6, in which the coupling loops lie on at least one common imaginary line and this imaginary line has a rectangular configuration.

8. Apparatus for the production of glow discharge according to claim 7, in which the coupling loops are disposed at regular intervals apart.

9. Apparatus for the production of glow discharge according to claim 8, in which the coupling loops are disposed alternately invertingly and noninvertingly.

10. Apparatus for the production of glow discharge according to claim 1, which includes a circulator integral with the waveguide ring resonator means.

* * * * *